June 10, 1969 H. R. LEE 3,449,641

EPOXY ENCAPSULATED SEMICONDUCTOR DEVICE WHEREIN THE ENCAPSULANT COMPRISES AN EPOXY NOVOLAK

Filed Jan. 11, 1966

INVENTOR:
HAROLD R. LEE,
BY Robert J. Mooney
HIS ATTORNEY.

3,449,641

EPOXY ENCAPSULATED SEMICONDUCTOR DEVICE WHEREIN THE ENCAPSULANT COMPRISES AN EPOXY NOVOLAK

Harold R. Lee, Auburn, N.Y., assignor to General Electric Company, a corporation of New York

Filed Jan. 11, 1966, Ser. No. 519,853
Int. Cl. H01l *7/00*
U.S. Cl. 317—234 12 Claims

ABSTRACT OF THE DISCLOSURE

An electronic component comprising a body of semiconductor material having metallic contacts and encapsulated in a moisture permeability-resistant filled epoxy resinous encapsulant having an epoxide equivalent weight of about 175 to 182 and cured with an amine-free mixed curing agent of nadic methyl anhydride and hexahydrophthalic anhydride.

This invention relates to improvements in electronic components such as semiconductor devices having a body of semiconductor material provided with leads connected to contact areas thereon, and enclosed in a plastic encapsulant from which the leads extends. More particularly, the invention relates to such devices of which the encapsulant is characterized by capability of sustained operation in high ambient temperatures of up to 200° C., and extreme resistance to penetration of moisture under high humidity conditions.

Semiconductor devices such as transistors are known in which a body or pellet of semiconductor material is mounted on a metallic member which may serve as all or part of the electrical connector or external lead from one of the functionally significant regions of the semiconductor body, such as the transistor emitter or base or collector region. Other electrical connectors such as wires or other electrically conductive members are connected to the other functionally significant regions of the pellet, and may in turn be attached to, or may themselves constitute, additional external electrical leads of the device. In such devices the assemblage, including the pellet and at least a portion of the electrical connectors thereto, is encapsulated, for example by casting or molding, in a suitable electrically insulative material such as a thermosetting plastic resinous composition from which the outer portions of the external leads extend. The external leads may additionally extend through a header of electrically insulative plastic material which serves to support, space, or orient the leads, and the encapsulating material may desirably extend to and form an encasement contiguous with the header.

Although the semiconductor pellet in such devices is frequently of the type wherein its electrically significant regions are at least partly protected from contamination by moisture and other environmental impurities by a protective coating carried directly by the semiconductor material itself, such as a thin layer of oxide of silicon in the case of a silicon pellet, the encapsulation provides further permanent protection against mechanical and thermal shock, chemical attack, or the like, and ruggedizes the device so as to simplify subsequent handling, packaging, shipping, and use.

A problem which has been encountered with this type of device is that of inability of the encapsulant to withstand high ambient temperautres such as 200° C. without degrading or decomposing. Another difficulty with such devices has been that of penetration of the encapsulant by moisture under high humidity conditions, causing undesirable electrical leakage currents and otherwise adversely affecting the electrical characteristics of the device.

Accordingly, one object of the present invention is to provide improved electronic components such as semiconductor devices of the encapsulated type having improved performance at high ambient temperatures up to 200° C.

Another object is to provide an improved plastic encapsulated electronic component of the foregoing character having enhanced resistance to permeability to moisture under prolonged exposure to high humidity conditions of up to 100% relative humidity.

Another object is to provide improved junction semiconductor devices of the foregoing character wherein the foregoing advantages are obtained with a minimum addition to the cost of the device and with a minimum of change or disruption of process or assembly steps heretofore employed in the manufacture of such devices.

Another object is to provide a low cost transistor of the epoxy resin encapsulated type in which chemical reaction with, or degration of, the semiconductor pellet by the epoxy resin encapsulant is substantially precluded at temperatures up to 200° C.

These and other objects of the invention will be apparent from the following description and the accompanying drawing wherein.

Figure 1:
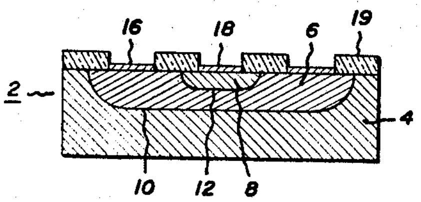
FIGURE 1 is an enlarged sectional view of a semiconductor body portion of one type of electronic component to which my invention is particularly applicable.
Figure 2:
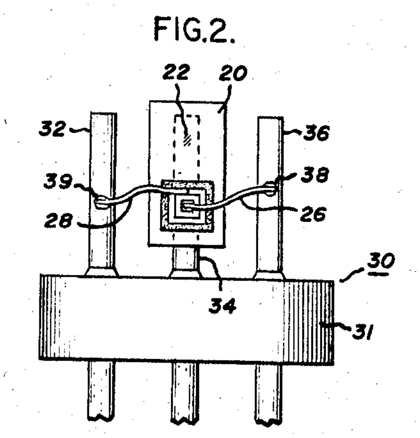
FIGURE 2 is a fragmentary view of a semiconductor device utilizing the pellet of FIGURE 1 and to which the present invention is particularly applicable, at an intermediate stage of manufacture of such semiconductor device.
Figure 3:
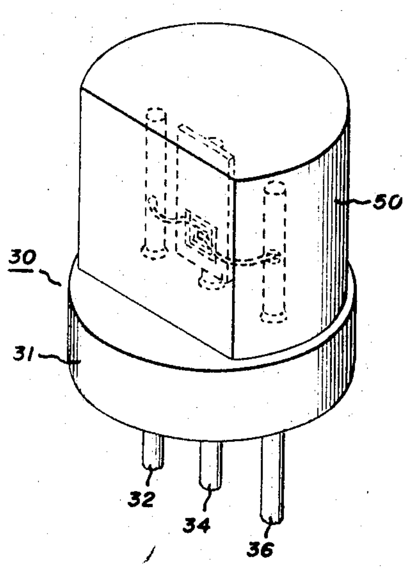
FIGURE 3 is a perspective view showing the structure of FIGURE 2 after manufacture is completed according to my invention.

Referring to the drawing, it will be appreciated that the present invention is applicable to a variety of electronic components such as semiconductor devices, but is illustrated for convenience and by way of example as applied to a transistor. As constructed in accordance with the present invention, the transistor shown includes an electrically active element consisting of a body of pellet 2 of semiconductor material, such as silicon, of wafer-like form having a thickness of, for example, 5 to 8 mils and having an area of, for example, 100 to 400 square mils. The pellet has a plurality of electrically active regions which may include, for example, a collector region 4, base region 6, and emitter region 8. The pellet may be suitably treated with additives or impurities, for example, by impurity diffusion, so that the base region 6 in of opposite conductivity type to that of the emitter region 8 and collector region 4, thus defining a pair of PN junctions, indicated generally at 10 and 12, within the pellet. The pellet may include, for example, a collector region 4 of N-type silicon, a P-type base region 6 formed by diffustion into the pellet of an impurity such as boron, and an N-type emitter region 8 formed by diffusion into the base region of an impurity such as phosphorus. Conductive coatings, for example of aluminum or other suitable metal or metallic material, are applied to the base and emitter regions, respectively, to form non-rectifying contacts 16, 18 facilitating attachment of respective leads thereto. At the surface of the pellet, between the emitter and base contacts 16, 18 and over the intersection of the loci of the junctions 10, 12 with the pellet surface, the pellet is provided with a protective covering 19 of insulative material, which in the case of a silicon pellet may conveniently consist of an oxide of the silicon.

The pellet is mounted on a carrier 20 which may consist, for example, of Kovar or steel, having ribbon-like cross-section of, for example, 50 mils in width and 5 to 10 mils in thickness. The major face of the pellet opposite that of the base and emitter contact regions 16, 18 is permanently conductively secured to carrier 20 as, for example, by soldering or welding to provide a non-rectifying conductive contact. To facilitate the attachment of the pellet to the carrier, an intermediate layer of a metal 24, such as gold or gold doped with an impurity of the same conductivity type as the collector region of the pellet, may be employed to form a solder between the carrier 20 and the pellet 2.

An emitter lead 26, such as an enlongated metallic member of gold or other suitable metal having a cross-section of the order of one square mil, is permanently joined at one of its ends in non-rectifying electrical contact to the emitter contact 18 of the pellet. A similar base lead 28 is likewise permanently joined to the base contact 16.

The carrier 20 is mechanically and electrically conductively attached as by a weld 22 to the center post 34 of a head assembly 30 including a platform or disk-shaped header 31 of electrically insulative plastic material through which the center post 34 extends. Likewise extending through the header 31 are side posts 32 and 36 to which the base lead 28 and emitter lead 26 are respectively secured as by welds 39, 38. The header 31 may serve as a permanent or temporary support for maintaining the spacing and relative position of the external leads constituted by the three posts 32, 34 and 36.

The semiconductor pellet 2 and the portion of its leads adjacent thereto are encapsulated in an electrically insulative thermally conductive encapsulant 50. A preferred encapsulant, according to the present invention, consists of an unmodified novolak epoxy resin having an epoxide equivalent weight of about 175, a softening point of about 210° C., a viscosity of about 30,000 to 90,000 centipoise at 52° C., and a specific gravity of about 1.22, such as the resin available commercially as D.E.N. 438 from the Dow Chemical Company, Midland, Mich., or that available commercially as Epotuf 37–170 from Reichhold Chemical, Inc., White Plains, N.Y. Further according to my invention, the encapsulating resin is cross-linked with a blended curing agent consisting of a mixture of nadic methyl anhydride ($C_{10}H_{10}O_3$), and hexahydrophthalic anhydride ($C_8H_{10}O_3$), both available commercially from Allied Chemical Company, New York, N.Y. A catalyst is used to accelerate curing. A preferred form of catalyst is one having no amines, such as to minimize formation of ammonium hydroxide in the presence of water. A preferred catalyst is one containing zinc octoate and triphenyl phosphite, such as that available commercially as Argus DB VIII from the Argus Chemical Corporation, Brooklyn, N.Y. Also, if desired, the encapsulant may be rendered opaque by addition of a suitable coloring material such as powdered black pigment, for example that available commercially as F–6331 from Ferro Corporation, Cleveland, Ohio. To enhance its thermal conductivity and reduce the amount of resin required for a given volume, the encapsulant may also include a chemically nonreactive electrically insulative filler of particulate material, such as powdered alumina, preferably of tabular or platelet-like particle form, available commercially as Tabular Alumina T–61 from Aluminum Company of America.

A satisfactory formulation for the encapsulant 50 is shown in column A of the following table:

| Ingredient | Percent by weight | |
|---|---|---|
| | Column A | Column B |
| Novolac epoxy resin (D.E.N. 438) | 15–20 | 55–65 |
| Curing agent, nadic methyl anhydride | 1.2–1.8 | 4–6 |
| Curing agent, hexahydrophthalic anhydride | 8–11 | 28–37 |
| Blended catalyst, Argus DB VIII | 0.8–1.0 | 2.8–3.4 |
| Filler, tabular alumina T–61 | 50–75 | ---------- |
| Coloring material, Ferro F–6331 | 0.5–1.5 | ---------- |

A preferred form of composition for the encapsulant may be compounded in a manner which will now be described:

*Step 1.*—17.1 parts by weight of the novolak epoxy resin, which has been preheated to 105° C. for at least two hours, are placed in a suitable container, such as a stainless steel pot or disposable paper container.

*Step 2.*—To the resin is then added 0.9 part by weight of the catalyst Argus DB VIII.

*Step 3.*—The foregoing ingredients are mixed at a temperature of 105° C. for a time sufficient to insure thorough blending, such as a few minutes.

*Step 4.*—To the foregoing mixture is added 1.5 parts by weight of nadic methyl anhydride curing agent.

*Step 5.*—Add 9.5 parts by weight of hexahydrophthalic anhydride curing agent.

*Step 6.*—Mix the foregoing ingredients at a temperature of 105° C. for a time sufficient to insure thorough blending, such as a few minutes.

*Step 7.* To the foregoing mixture add 1.0 part by weight of pigment F–6331 and 70.0 parts by weight of the T–61 tabular alumina filler which has previously been dehydrated as by drying in air at 105° C. for at least 16 hours.

*Step 8.*—Mix the foregoing ingredients sufficiently to insure thorough blending.

The resulting mixture is a viscous liquid which is ready for immediate application to a mold, or may be preserved for future use by refrigerating at a temperature of about −5° F. to postpone curing, at which temperature the shelf life of the mixture is at least three months.

An alternative form of encapsulant, without the filler and with or without the coloring material as desired, may be prepared by mixing according to the first six of the eight above-described steps the ingredients as shown in column B of the foregoing table.

An exemplary application of an encapsulant formulated as above described to a semiconductor device pellet and leads to be encapsulated will now be described:

*Step 1.*—A suitable mold, which may be made, for example, of silicone rubber, is preheated for at least 20 minutes at a temperature of, for example, 125° C.

*Step 2.*—A suitable quantity of the uncured epoxy encapsulant, formulated as hereinabove described, is preheated for a time sufficient to bring it to a uniform temperature of about 125° C.

*Step 3.*—The structure to be encapsulated is placed within the mold and the preheated encapsulant is introduced into the mold in a quantity sufficient to fill the mold.

*Step 4.*—The encapsulant is cured in the mold at a temperature of about 125° C. for a time, such as about 1 to 2½ hours, long enough to produce sufficient gelling of the encapsulant to permit removal from the mold without damage to the mold or molded structure. If desired, during the initial portion of such cure, a vacuum may be drawn on the encapsulant to remove entrapped air or other bubbles.

*Step 5.*—The partially cured encapsulated structure is removed from the mold.

*Step 6.*—Curing of the encapsulant is completed after removal from the mold, by baking for about 16 hours at a temperature in the range of 180–230° C.

To maximize the temperature at which the resulting product is stable, it is desirable to employ as high a final cure temperature as possible without deleteriously affecting the product. Hence final cure temperatures of up to 230° C. may be employed for such purpose.

Either of the formulations defined in column A or column B of the foregoing table may be applied alternatively in accordance with known transfer molding techniques by preliminarily mixing a batch of the encapsulating material as above described, allowing the resulting compound to gel without exceeding polymerizing temperatures, and then reducing the resulting solid mass to a finely divided or particulate form suitable for use with conventional transfer molding equipment and techniques.

Figure 4:
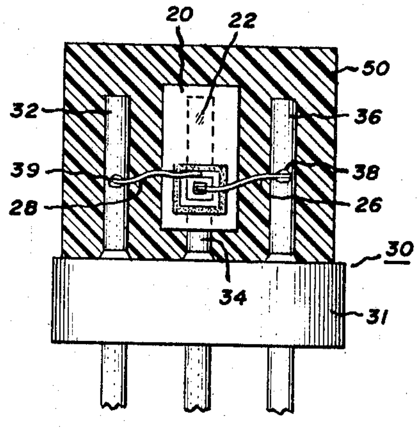
FIGURE 4 is an enlarged fragmentary sectional view of a portion of the structure of FIGURE 3.

The remarkable advantage of an electronic component such as a semiconductor device encapsulated as above described, in comparison with prior art plastic encapsulated semiconductor devices, may be appreciated from the fact that transistors such as shown in FIGURE 4 and made according to the present invention, after being stored in an environment with relative humidity of 100% at 40° C. for 5,000 hours in a non-energized condition, exhibited extremely low leakage current $I_{CES}$. That is, such transistors when energizer after such prolonged high humidity storage showed a leakage current $I_{CES}$ of only about 0.6 nanoampere with a 20-volt potential connected between the collector and the tied-together emitter and base. This compares wih prior art plastic encapsulated transistors which under similar test conditions exhibit leakage currents $I_{CES}$ four to five orders of magnitude greater. Therefore, while preserving all of the low cost advantages which make prior art plastic encapsulated semiconductor devices so attractive for the consumer market, the present invention provides devices which are capable of meeting additionally the far more stringent high ambient temperature toleration and moisture permeability-resistant requirements of certain industrial and military applications.

It will be appreciated by those skilled in the art that the invention may be carried out in various ways and may take various forms and embodiments other than the illustrative embodiments heretofore described. Accordingly, it is to be understood that the scope of the invention is not limited by the details of he foregoing descripion, but will be defined in the following claims.

What I claim as new and desire to secure by Letters Patent of the United States is:

1. An electronic component comprising a body of semiconductor material, metallic contacts on said body, metallic leads joined to said contacts and extending therefrom, and a moisture permeability-resistant encapsulant which is directly contiguous with and encloses said semiconductor body and a portion of said leads, said encapsulant comprising an epoxy resinous composition which is thermally stable at 200° C. and amine-free and includes a novolak epoxy resin having an epoxide equivalent weight of about 175 to 182 cross-linked with a curing agent blended of about 13 percent by weight (methylbicyclo (2.2.1) heptene-2,3-dicarboxylic anhydride) and about 8.7 percent by weight hexahydrophthalic anhydride.

2. The component of claim 1 wherein said resinous composition further comprises a filler of a particulate electrically insulative material.

3. The component in claim 1 wherein said resinous composition further contains a catalyst comprising a mixture of zinc octoate and triphenyl phosphite.

4. The component defined in claim 2 wherein said filler is particulate alumina.

5. A semiconductor device comprising a body of semiconductor material having at least one major face, a layer of an oxide of silicon covering said one major face and having apertures therein, metallic contacts on said body situated in said apertures, metallic leads joined to said contacts and extending therefrom, and a moisture permeability-resistant encapsultant which is directly contiguous with an encloses said semiconductor body and a portion of said leads, said encapsulant comprising a resinous composition which is thermally stable at 200° C. and amine-free including a novolak epoxy resin having an epoxide equivalent weight of about 175 to 182, a curing agent for said resin consisting of a mixture of about 13 percent by weight (methylbicyclo (2.2.1) heptene-2,3-dicarboxylic anhydride) and about 87 percent by weight hexahydrophthalic anhydride.

6. The device of claim 5 wherein said resinous composition further comprises a filler of about 50 to 75 percent by weight particulate alumina in platelet form, and said novolak epoxy resin is about 15–20 percent by weight of said resinous composition.

7. The device of claim 5 wherein said resinous composition further includes a catalyst comprising a mixture of zinc octoate and triphenyl phosphite, said catalyst constituting by weight about 0.8–3.4 percent of said resinous composition.

8. An amine-free, moisture permeability-resistant encapsulant for a semiconductor device including a body of semiconductor material having metallic leads extending therefrom, said body being contiguous with said encapsulant, said encapsulant being thermally stable at 200° C. and comprising an epoxy resinous composition including by weight about 55 to 65 percent novolak epoxy resin having an epoxide equivalent weight of about 175 to 182, about 4 to 6 percent (methylbicyclo (2.2.1) heptene-2,3-dicarboxylic anhydride) curing agent, about 28 to 37 percent hexahydrophthalic anhydride curing agent, and about 2.8 to 3.4 percent of a catalyst comprising a mixture of zinc octoate and triphenyl phosphite.

9. An encapsulant as defined in claim 8, further comprising a filler of particulate alumina.

10. An amine-free, moisture permeability-resistant encapsulant which is thermally stable at 200° C. for a semiconductor device including a body of semiconductor material having metallic leads extending therefrom, comprising an epoxy resinous composition comprising by weight about 15 to 20 percent novolak epoxy resin having an epoxide equivalent weight of about 175 to 182, 1.2 to 1.8 percent (methylbicyclo (2.2.1) heptene-2,3-dicarboxylic anhydride) curing agent, 8 to 11 percent hexahydrophthalic anhydride curing agent, about 50 to 75 percent particulate alumina, and about 0.8 to 1.0 percent of a catalyst comprising a mixture of zinc octoate and triphenyl phosphite.

11. The moisture permeability-resistant encapsulant of claim 10 wherein said resinous composition includes about 0.5 to 1.5 percent coloring material.

12. The moisture permeability-resistant encapsulant of claim 8 wherein said resinous composition includes about 0.5 to 1.5 percent coloring material.

References Cited

UNITED STATES PATENTS

| | | | |
|---|---|---|---|
| 3,326,856 | 6/1967 | Barie et al. | 260—47 |
| 3,214,409 | 10/1965 | Peerman | 260—59 |
| 3,278,813 | 10/1966 | Fahey | 317—234 |
| 3,301,795 | 1/1967 | Wooster | 260—2 |
| 3,364,159 | 1/1968 | Hecker et al. | 260—18 |

OTHER REFERENCES

Chem. Abstracts, vol. 58, 1963, 1596e–h, 1597a, Argus Chemical.

Skeisf, Epoxy Resins, 1958, pp. 3–4, 45–57, 159–179 and 202–204.

WILLIAM H. SHORT, *Primary Examiner.*

HOWARD SCHAIN, *Assistant Examiner.*

U.S. Cl. X.R.

117—128.4; 174—52; 260—19, 38, 59, 826; 264—272, 331